United States Patent
Sato

(10) Patent No.: US 11,443,947 B2
(45) Date of Patent: Sep. 13, 2022

(54) METHOD FOR FORMING ETCHING MASK AND METHOD FOR MANUFACTURING SEMICONDUCTOR DEVICE

(71) Applicant: KIOXIA CORPORATION, Tokyo (JP)

(72) Inventor: Hironobu Sato, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 191 days.

(21) Appl. No.: 16/805,103

(22) Filed: Feb. 28, 2020

(65) Prior Publication Data

US 2021/0082699 A1 Mar. 18, 2021

(30) Foreign Application Priority Data

Sep. 13, 2019 (JP) .............................. JP2019-167499

(51) Int. Cl.
*H01L 21/033* (2006.01)
*H01L 21/311* (2006.01)

(52) U.S. Cl.
CPC ...... *H01L 21/0337* (2013.01); *H01L 21/0338* (2013.01); *H01L 21/31144* (2013.01); *H01L 21/0332* (2013.01)

(58) Field of Classification Search
None
See application file for complete search history.

(56) References Cited

U.S. PATENT DOCUMENTS

| 9,245,789 | B2 | 1/2016 | Okamoto et al. |
| 9,684,234 | B2* | 6/2017 | Darling ................... G03F 7/405 |
| 2004/0152294 | A1 | 8/2004 | Choi |
| 2012/0241411 | A1* | 9/2012 | Darling ............... H01L 21/0274 |
| | | | 216/67 |
| 2014/0346142 | A1* | 11/2014 | Chapuis ................ G03F 7/0002 |
| | | | 216/51 |
| 2016/0056048 | A1 | 2/2016 | Honda |
| 2016/0363868 | A1* | 12/2016 | Somervell ............. G03F 7/2024 |
| 2019/0189424 | A1* | 6/2019 | Thorum ............ H01L 21/02057 |

* cited by examiner

*Primary Examiner* — Stephanie P Duclair
(74) *Attorney, Agent, or Firm* — Kim & Stewart LLP

(57) ABSTRACT

A method for forming an etching mask includes forming a mask layer containing an organic material on a layer to be patterned using the etching mask in a subsequent etching process, processing the mask layer to form a pattern including an opening, forming a filling layer in the opening, impregnating the mask layer with a metal material, and removing the filling layer. The organic material in the mask layer includes reaction sites that react with the metal material, and the filling layer has fewer the reaction sites per the unit volume than the mask layer.

20 Claims, 18 Drawing Sheets

US 11,443,947 B2

METHOD FOR FORMING ETCHING MASK AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2019-167499, filed on Sep. 13, 2019, the entire contents of which are incorporated herein by reference.

FIELD

Embodiments described herein relate generally to a method for forming an etching mask and a method for manufacturing a semiconductor device.

BACKGROUND

In a method for manufacturing a semiconductor device such as a three-dimensional memory, there is a technology of etching a workpiece by using a hard mask including a metal oxide as an etching mask.

DETAILED DESCRIPTION

Figure 1:
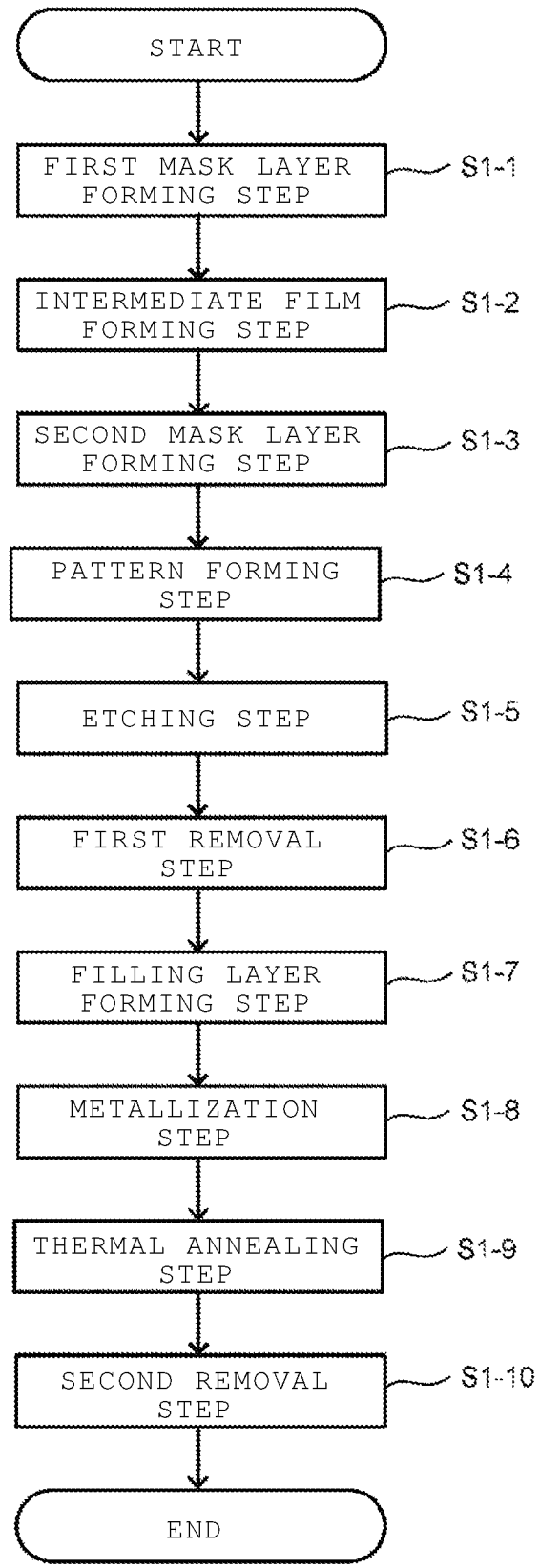
FIG. 1 is a flowchart illustrating an example of a method for forming an etching mask according to a first embodiment.

Embodiments are directed to enhancing dimensional accuracy of a pattern of a hard mask.

In general, according to an embodiment, a method for forming an etching mask includes forming a mask layer containing an organic material on a layer to be patterned using the etching mask in a subsequent etch processing, processing the mask layer to form a pattern including an opening, forming a filling layer in the opening, impregnating the mask layer with a metal material, and removing the filling layer. The organic material in the mask layer includes reaction sites that react with the metal material. The filling layer has fewer reaction sites per the unit volume than the mask layer.

Hereinafter, various example embodiments will be described with reference to the drawings. The drawings are, in general, schematic and as such depicted relationships in the figures between the thicknesses of each component or element in the drawings and the planar dimensions, a ratio of the thicknesses of the components/elements, and the like may be different from those in an implemented embodiment of the present disclosure. Furthermore, in drawings and in description of various embodiments, those components, elements, or aspects which are substantially the same figure to figure or embodiment to embodiment may be denoted using the same reference numerals, and a description such components, elements, or aspects may be omitted as appropriate.

First Embodiment

FIG. 1 is a flowchart illustrating an example of a method for forming an etching mask, which is a hard mask, according to a first embodiment. As illustrated in FIG. 1, the example of the method for forming the etching mask includes a first mask layer forming step (S1-1), an intermediate film forming step (S1-2), a second mask layer forming step (S1-3), a pattern forming step (S1-4), an etching step (S1-5), a first removal step (S1-6), a filling layer forming step (S1-7), a metallization step (S1-8), a thermal annealing step (S1-9), and a second removal step (S1-10).

First Mask Layer Forming Step

Figure 2:
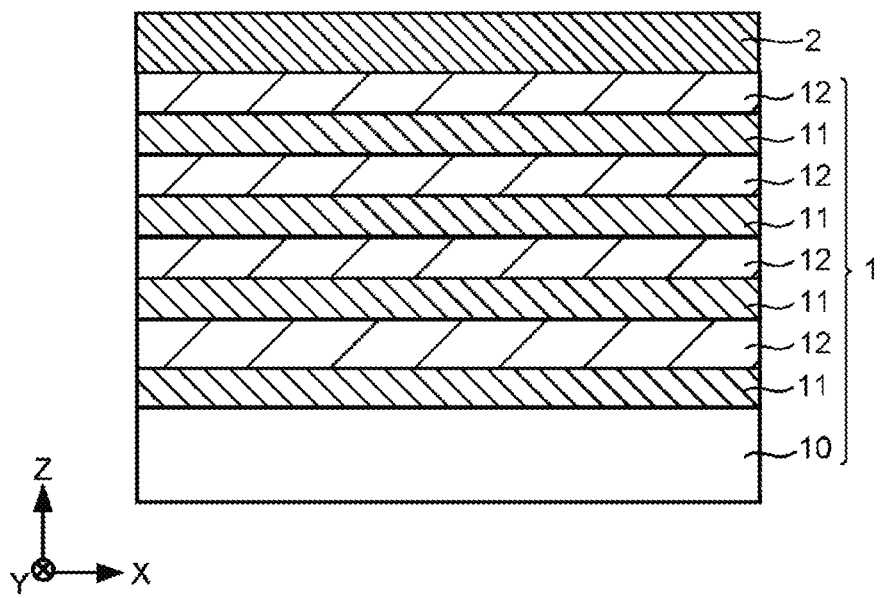
FIG. 2 illustrates a schematic cross-sectional view of a structure to illustrate an example of a first mask forming step according to the first embodiment.

FIG. 2 illustrates a schematic cross-sectional view of a structure to illustrate an example of the first mask forming step, and illustrates a part of an X-Z section including an X axis of a layer 1 to be processed and a Z axis orthogonal to the X axis and orthogonal to a Y axis orthogonal to the X axis. In the first mask forming step, a mask layer 2 is formed on the layer 1 to be processed as illustrated in FIG. 2. Hereinafter, the layer 1 to be processed is referred to as a "workpiece."

The workpiece 1 includes a substrate 10, and a stack having first layers 11 and second layers 12 alternately stacked on the substrate 10. The workpiece 1 may have another layer between the substrate 10 and the first layer 11. The first layers 11 and the second layers 12 are examples of films to be processed, which are provided on the substrate 10, and the configurations of the films to be processed are not limited to the configurations illustrated in FIG. 2.

The substrate 10, for example, includes a semiconductor substrate such as a silicon substrate and a silicon carbide substrate, an insulating substrate such as a glass substrate, a quartz substrate, and a sapphire substrate, and a compound semiconductor substrate such as a GaAs substrate.

The first layer 11 is a sacrificial layer. The sacrificial layer is a region where a conductive layer is formed later. The first layer 11 includes a silicon nitride film, for example. The second layer 12 includes a silicon oxide film, for example.

The mask layer 2 contains an organic material having reaction sites that react with a metal material introduced in the metallization step. The reaction site that reacts with the metal material includes, for example, an unshared electron pair to which the metal material can coordinate, and includes, for example, an unshared electron pair and the like existing in a functional group such as a carbonyl group or a carboxyl group in a polymer. The organic material includes a spin on carbon (SOC) film and a photoresist, for example. The SOC film is a carbon-based thin film formed by applying a material including carbon and a spin coating method. The photoresist is formed using a resin material, for example.

Intermediate Film Forming Step

Figure 3:
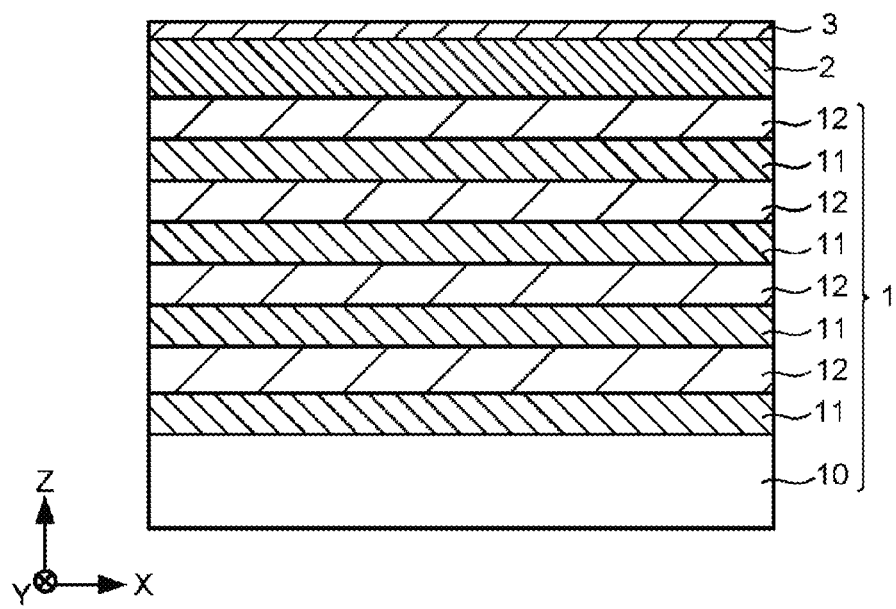
FIG. 3 illustrates a schematic cross-sectional view of a structure to illustrate an example of an intermediate film forming step according to the first embodiment.

FIG. 3 illustrates a schematic cross-sectional view of a structure to illustrate an example of the intermediate film forming step, and illustrates a part of the XZ section of the workpiece 1. In the intermediate film forming step, as illustrated in FIG. 3, an intermediate film 3 is formed on the mask layer 2. The intermediate film 3 serves as an antireflection film.

The intermediate film 3 is formed using a spin on glass (SOG) film, for example. The SOG film is a silicon-based thin film formed by applying a material including a silicon oxide, such as siloxane, or silicon and then performing a spin coating.

Second Mask Layer Forming Step

Figure 4:
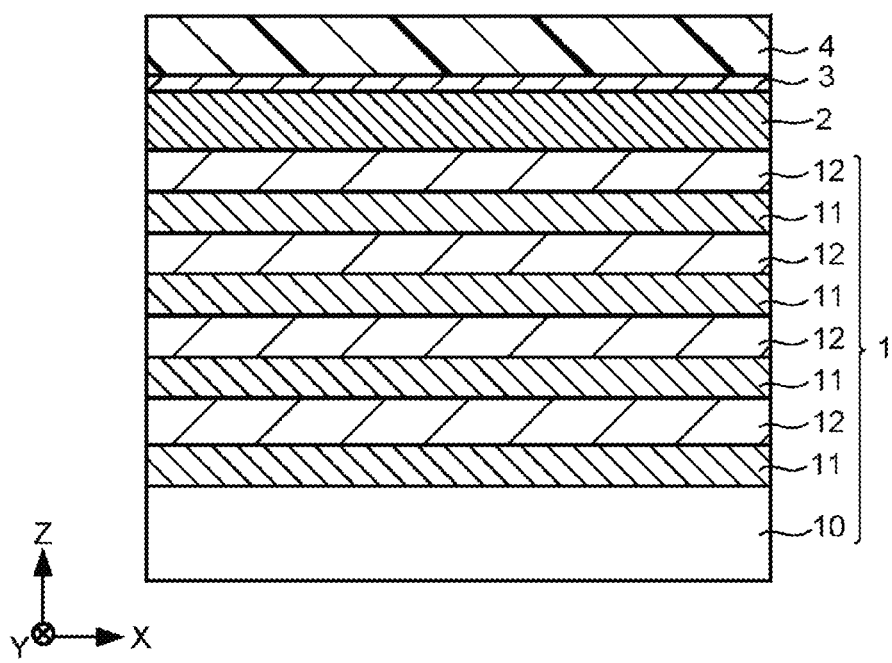
FIG. 4 illustrates a schematic cross-sectional view of a structure to illustrate an example of a second mask forming step according to the first embodiment.

FIG. 4 illustrates a schematic cross-sectional view of a structure to illustrate an example of the second mask layer forming step, and illustrates a part of the X-Z section of the workpiece 1. In the second mask layer forming step, as illustrated in FIG. 4, a mask layer 4 is formed on the intermediate film 3.

The mask layer 4 contains, for example, an organic material having reaction sites that react with the metal material introduced in the metallization step. The organic material includes a photoresist, for example. The photoresist is formed using a resin material, for example.

Pattern Forming Step

Figure 5:
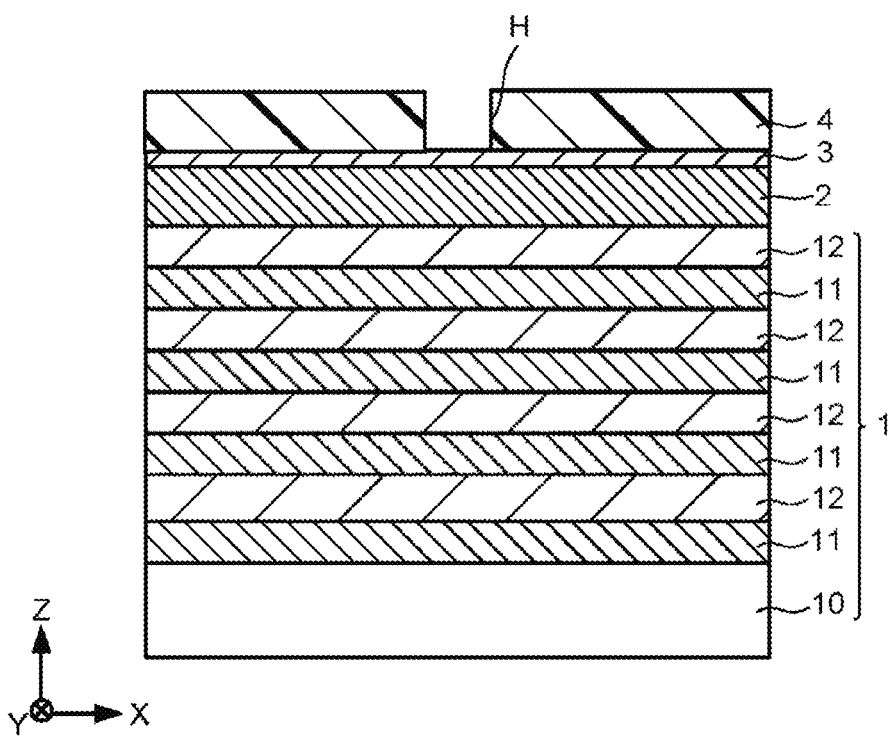
FIG. 5 illustrates a schematic cross-sectional view of a structure to illustrate an example of a first removal step according to the first embodiment.

FIG. 5 illustrates a schematic cross-sectional view of a structure to illustrate an example of the pattern forming step, and illustrates a part of the X-Z section of the workpiece 1. In the pattern forming step, as illustrated in FIG. 5, the mask layer 4 is processed to form a pattern including an opening H. The mask layer 4 is processed using photolithography, for example. Furthermore, the mask layer 4 may be processed using a directed self-assembly (DSA) technology. The DSA technology is a technology in which a polymer such as a block copolymer is used for the mask layer 4 and the mask layer 4 is phase-separated to form a fine pattern.

Etching Step

Figure 6:
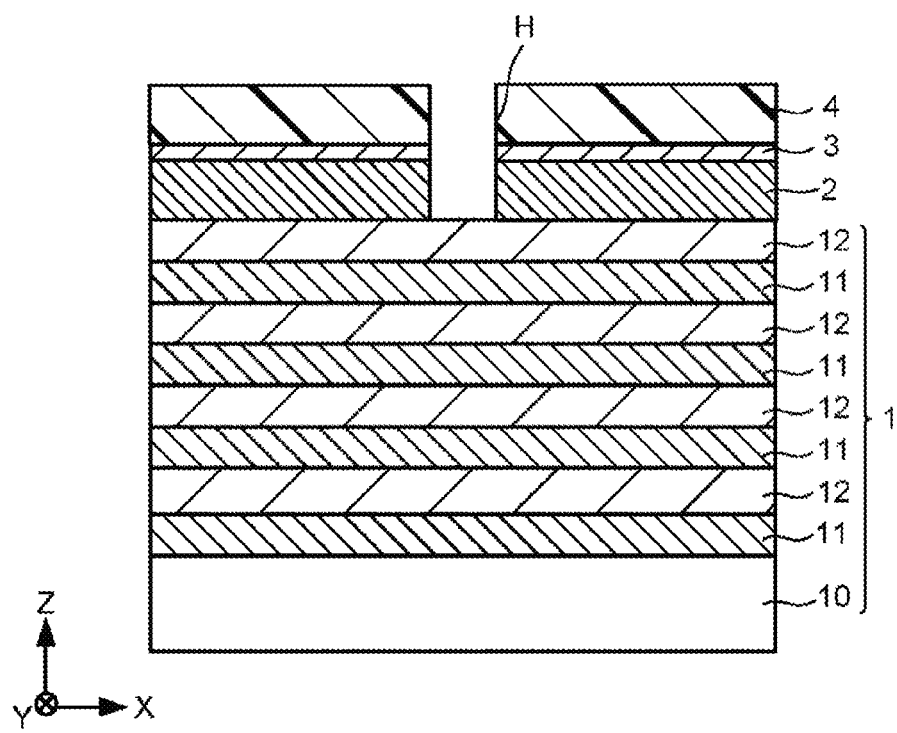
FIG. 6 illustrates a schematic cross-sectional view of a structure to illustrate an example of an etching step according to the first embodiment.

FIG. 6 illustrates a schematic cross-sectional view of a structure to illustrate an example of the etching step, and illustrates a part of the XZ section of the workpiece 1. In the etching step, as illustrated in FIG. 6, the intermediate film 3 and the mask layer 2 are etched using the mask layer 4 to transfer the pattern of the mask layer 4 to the mask layer 2. The intermediate film 3 and the mask layer 2 are etched using dry etching or wet etching, for example. A method of etching the mask layer 2 using the intermediate film 3 and the mask layer 4 is referred to as a stacked mask process (SMAP). The present disclosure is not limited to the SMAP and the mask layer 2 may be processed using other methods.

First Removal Step

Figure 7:
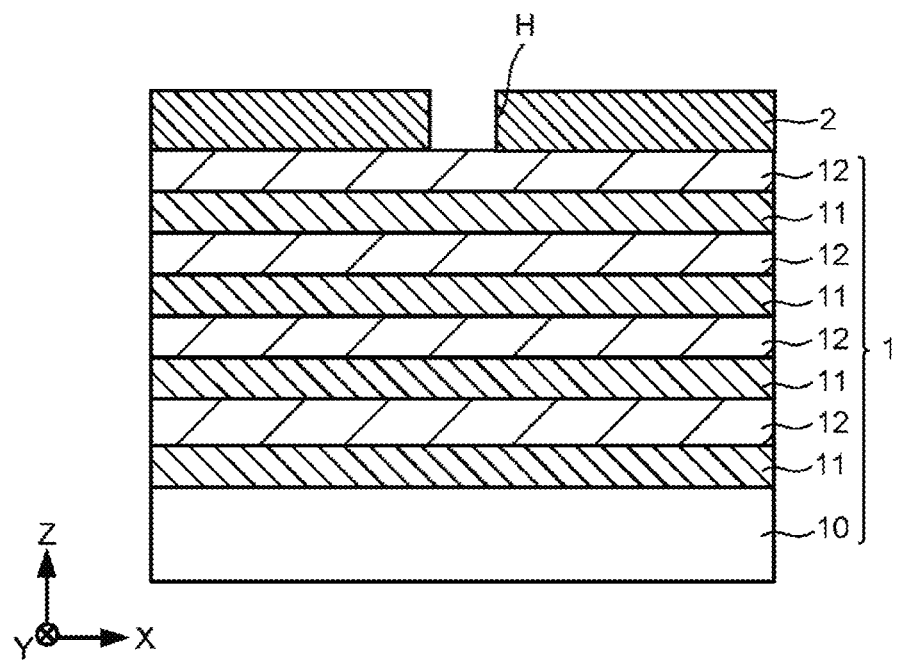
FIG. 7 illustrates a schematic cross-sectional view of a structure to illustrate an example of a first removal step according to the first embodiment.

FIG. 7 illustrates a schematic cross-sectional view of a structure to illustrate an example of the first removal step, and illustrates a part of the XZ section of the workpiece 1. In the first removal step, as illustrated in FIG. 7, the intermediate film 3 and the mask layer 4 are removed. The intermediate film 3 and the mask layer 4 are removed by surface treatment such as etching and chemical mechanical polishing (CMP), for example.

Filling Layer Forming Step

Figure 8:
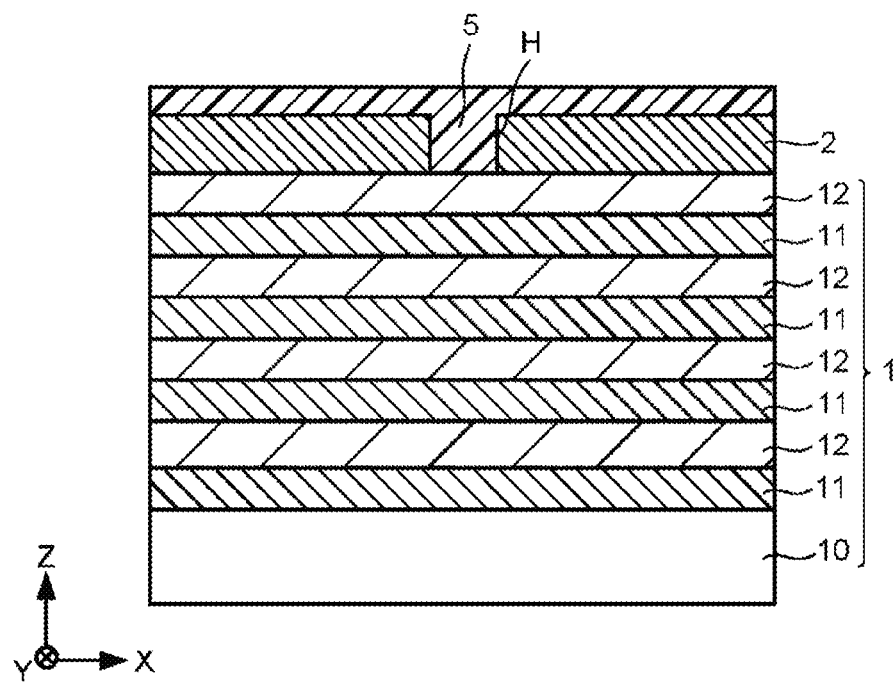
FIG. 8 illustrates a schematic cross-sectional view of a structure to illustrate an example of a filling layer forming step according to the first embodiment.
Figure 9:
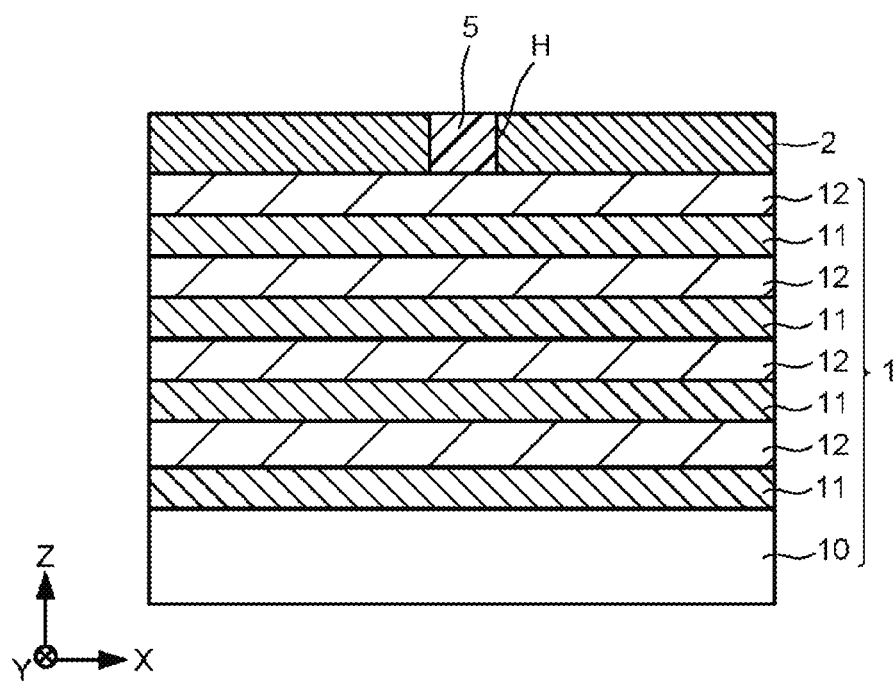
FIG. 9 illustrates a schematic cross-sectional view of a structure to illustrate an example of the filling layer forming step according to the first embodiment.

FIG. 8 and FIG. 9 illustrate schematic cross-sectional views of a structure to illustrate an example of the filling layer forming step, and illustrate a part of the X-Z section of the workpiece 1. In the filling layer forming step, a filling layer 5 is formed on the mask layer 2 and in the opening H as illustrated in FIG. 8, and for example, the surface of the filling layer 5 is processed to be level with the surface of the mask layer 2 by surface treatment such as etching and CMP as illustrated in FIG. 9. The present disclosure is not limited thereto and the filling layer 5 may be formed using a spin coating method, for example.

The filling layer 5 adheres firmly to the mask layer 2. The filling layer 5 includes an organic material in which the number of reaction sites that react with the metal material introduced in the metallization step is smaller than that in the mask layer 2 or the mask layer 4 or there are no reaction sites. The organic material includes a SOG film, silicon oxide, or polysilazane, for example. In an embodiment, the number of reaction sites above and hereinafter may be referred to as a number of reaction sites per unit volume.

After the mask layer 2 is processed and before the filling layer 5 is formed, for example, a step of exposing the mask layer 2 to a plasma including oxygen may be performed. In this way, for example, impurities attached to the surface of the mask layer 2 during the etching step can be removed, so that adhesion between the mask layer 2 and the filling layer 5 can be further enhanced.

Metallization Step

Figure 10:
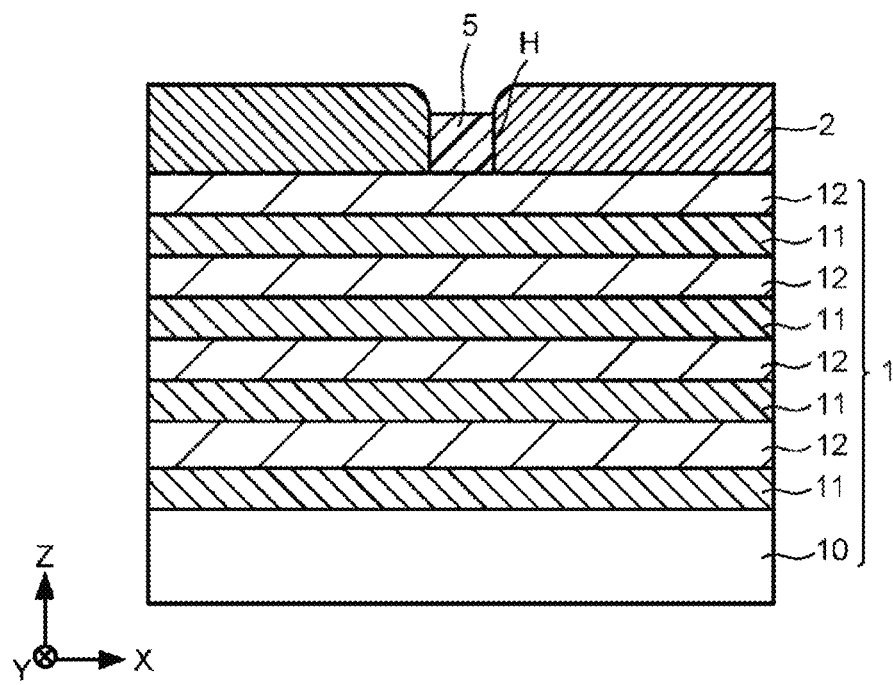
FIG. 10 illustrates a schematic cross-sectional view of a structure to illustrate an example of a metallization step according to the first embodiment.

FIG. 10 illustrates a schematic cross-sectional view of a structure to illustrate an example of the metallization step, and illustrates a part of the X-Z section of the workpiece 1. The metallization step is a step of metallizing the mask layer 2 by introducing a metal into the mask layer 2. In the metallization step, the mask layer 2 is exposed to gas including the metal material to impregnate the mask layer 2 with the metal material. After the gas including the metal material is exhausted, the mask layer 2 is exposed to oxidizing gas including water, for example. When the mask layer 2 is exposed to the oxidizing gas, so that the oxidizing gas can oxidize the metal material to form an oxide of the metal material. The oxidizing gas is exhausted after the exposure.

The metal material includes at least one metal element selected from the group consisting of aluminum, titanium, hafnium, zirconium, and vanadium, for example. The metal material is a precursor available in a chemical vapor deposition (CVD) method or an atomic layer deposition (ALD) method, for example. The precursor is at least one selected from the group consisting of aluminum trichloride ($AlCl_3$), titanium tetrachloride ($TiCl_4$), tungsten hexachloride ($WCl_6$), vanadium tetrachloride ($VCl_4$), hafnium tetrachloride ($HfCl_4$), zirconium tetrachloride ($ZrCl_4$), and trimethylaluminum (TMA), for example. When a plurality of precursors are used, it is preferred to use precursors that hardly react or do not react with each other.

When the mask layer 2 is impregnated with the metal material, the mask layer 2 is expanded as illustrated in FIG. 10 and compressive stress is generated in the mask layer 2. On the other hand, since the filling layer 5 has fewer reaction sites than the mask layer 2 or has no reaction sites, the gas including the metal material passes through the filling layer 5 without staying in the filling layer 5. Since the filling layer 5 is not expanded, the dimension of the opening H is maintained. In other words, the volume change amount of the filling layer 5 before and after the metallization step is smaller than that of the mask layer 2 before and after the metallization step. Furthermore, since the filling layer 5 adheres firmly to the mask layer 2, even though the mask layer 2 is expanded, the filling layer 5 is hardly peeled off from the mask layer 2. Consequently, it is possible to suppress deformation of the pattern due to the expansion of the mask layer 2.

Thermal Annealing Step

Figure 11:
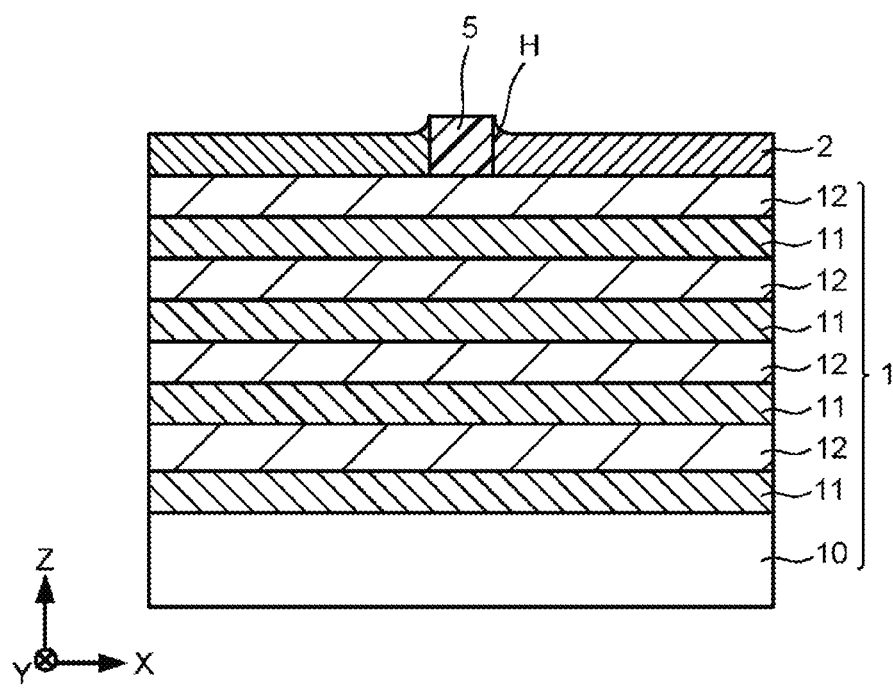
FIG. 11 illustrates a schematic cross-sectional view of a structure to illustrate an example of a thermal annealing step according to the first embodiment.

FIG. 11 illustrates a schematic cross-sectional view of a structure to illustrate an example of the thermal annealing step, and illustrates a part of the X-Z section of the workpiece 1. In the thermal annealing step, the mask layer 2 is annealed to promote crystallization of the oxide of the metal material in the mask layer 2. In this way, it is possible to enhance etching tolerance of the etching mask, particularly, high reactive ion etching (RIE) tolerance. For example, when a pattern having a high aspect ratio is formed, since the etching mask is exposed to etching gas for a long time, high etching tolerance is required. Preferably, the annealing temperature is equal to or more than the crystallization temperature of the oxide of the metal material introduced into the mask layer 2, for example. For that reason, the annealing temperature is appropriately set depending on the type of a metal material to be used.

In the thermal annealing step, as illustrated in FIG. 11, the mask layer 2 is contracted and tensile stress is generated in the mask layer 2. However, since the filling layer 5 adheres firmly to the mask layer 2, even though the mask layer 2 is contracted, the filling layer 5 is hardly peeled off from the mask layer 2. The thermal annealing step may not be performed.

Second Removal Step

Figure 12:
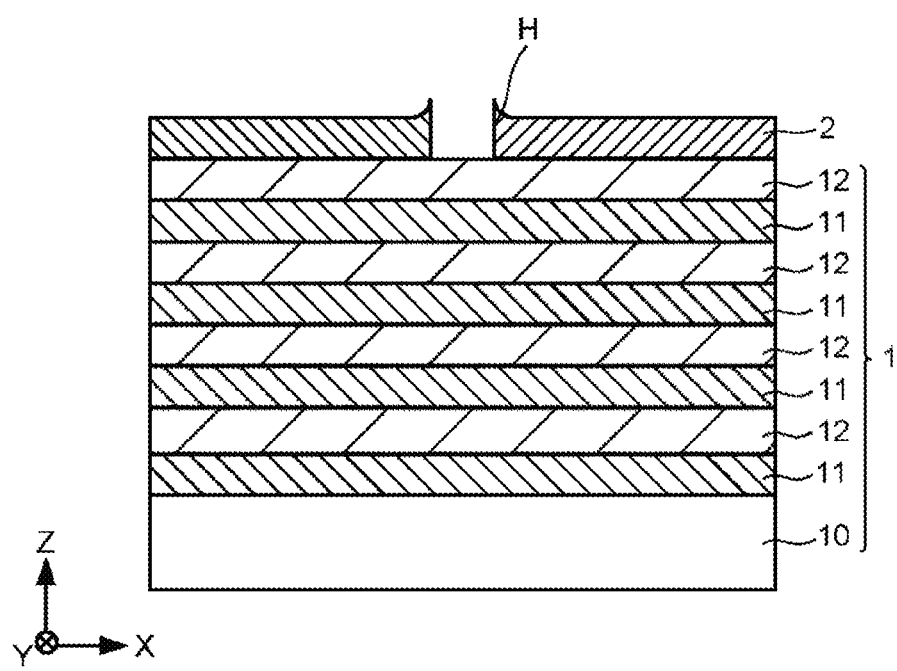
FIG. 12 illustrates a schematic cross-sectional view of a structure to illustrate an example of a second removal step according to the first embodiment.

FIG. 12 illustrates a schematic cross-sectional view of a structure to illustrate an example of the second removal step, and illustrates a part of the X-Z section of the workpiece 1. In the second removal step, as illustrated in FIG. 12, the filling layer 5 is removed from the opening H. The filling layer 5 is removed using dry etching or wet etching, for example. When the wet etching is used, an etching stop layer such as a silicon nitride film may be formed under the mask layer 2.

As described above, in the present embodiment, after forming the filling layer 5 in which the number of reaction sites is smaller than that in the mask layer 2 or there are no reaction sites, the mask layer 2 is metallized, so that it is possible to suppress deformation of the pattern due to the expansion of the mask layer 2. As a result, it is possible to enhance the dimensional accuracy of the hard mask.

Second Embodiment

Figure 13:
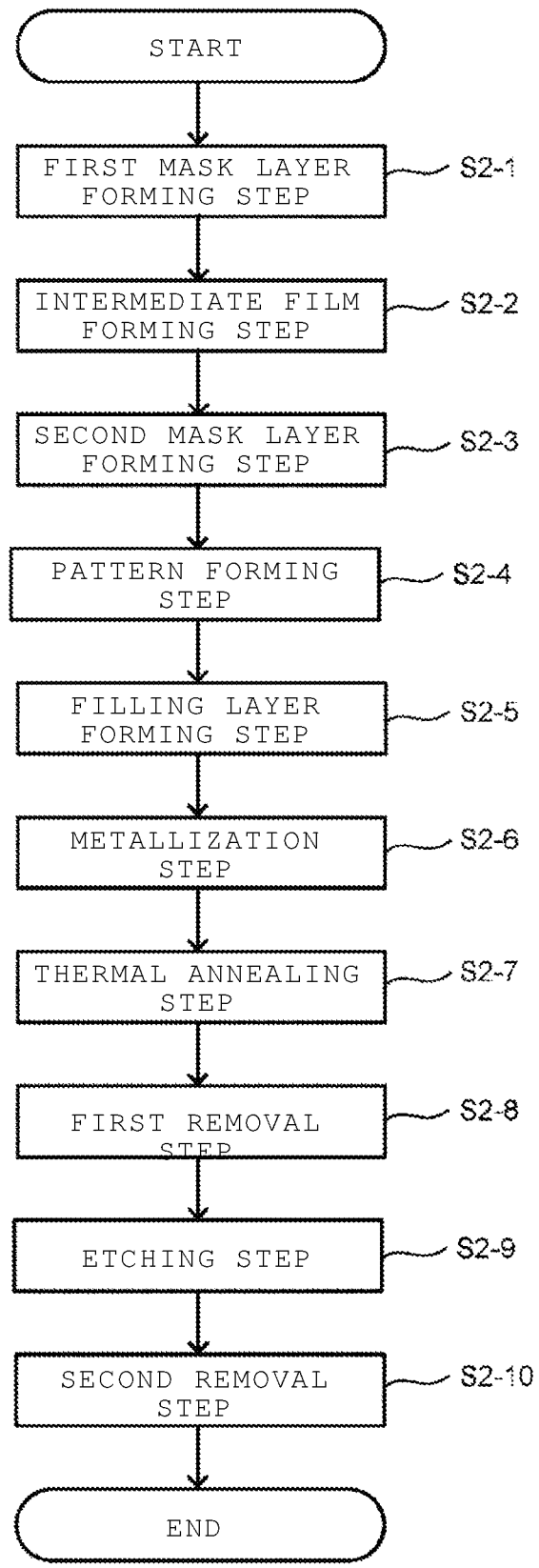
FIG. 13 is a flowchart illustrating an example of a method for forming an etching mask according to a second embodiment.

FIG. 13 is a flowchart illustrating an example of a method for forming an etching mask according to a second embodiment. As illustrated in FIG. 13, the other example of the method for forming the etching mask includes a first mask layer forming step (S2-1), an intermediate film forming step (S2-2), a second mask layer forming step (S2-3), a pattern forming step (S2-4), a filling layer forming step (S2-5), a metallization step (S2-6), a thermal annealing step (S2-7), a first removal step (S2-8), an etching step (S2-9), and a second removal step (S2-10). Since the first mask layer forming step (S2-1), the intermediate film forming step (S2-2), the second mask layer forming step (S2-3), and the pattern forming step (S2-4) are the same as the first mask layer forming step (S1-1), the intermediate film forming step (S1-2), the second mask layer forming step (S1-3), and the pattern forming step (S1-4) in the first embodiment, a description thereof will be omitted.

Filling Layer Forming Step

Figure 14:
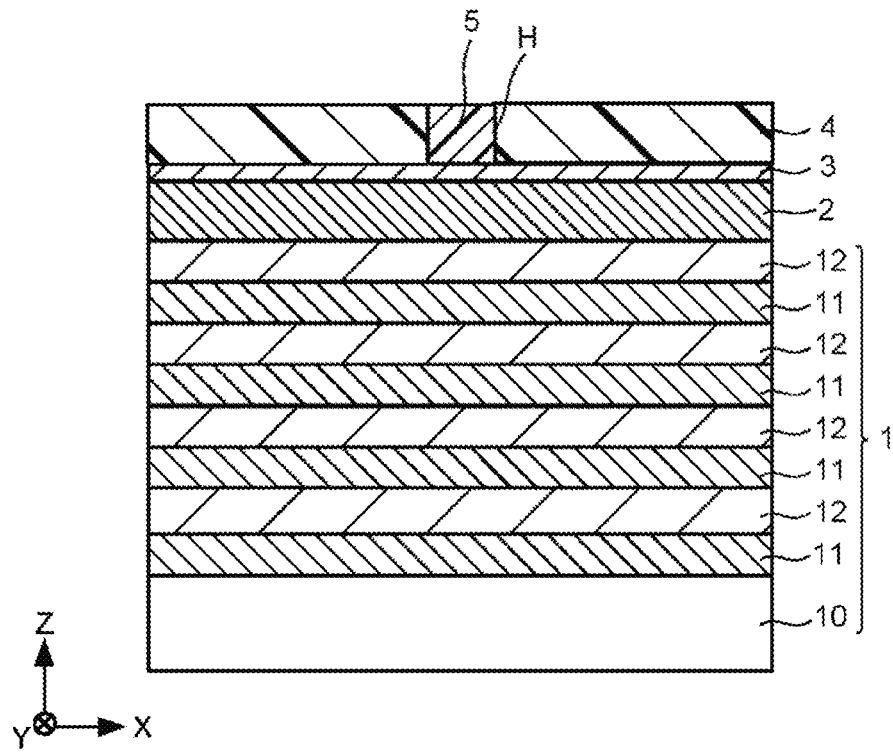
FIG. 14 illustrates a schematic cross-sectional view of a structure to illustrate an example of a filling layer forming step.

FIG. 14 illustrates a schematic cross-sectional view of a structure to illustrate an example of the filling layer forming step, and illustrate a part of the X-Z section of the workpiece 1. In the filling layer forming step, a filling layer 5 is formed on the mask layer 4 and in the opening H, and for example, the surface of the filling layer 5 is processed to be level with the surface of the mask layer 4 by surface treatment such as etching and CMP as illustrated in FIG. 14. The present disclosure is not limited thereto and the filling layer 5 may be formed using a spin coating method, for example. The description of the filling layer 5 of the first embodiment may be used as appropriate for other descriptions of the filling layer 5.

After the mask layer 4 is processed and before the filling layer 5 is formed, for example, a step of exposing the mask layer 4 to a plasma including oxygen may be performed. In this way, for example, impurities attached to the surface of the mask layer 4 during the pattern forming step can be removed, so that adhesion between the mask layer 4 and the filling layer 5 can be further enhanced.

Metallization Step

Figure 15:
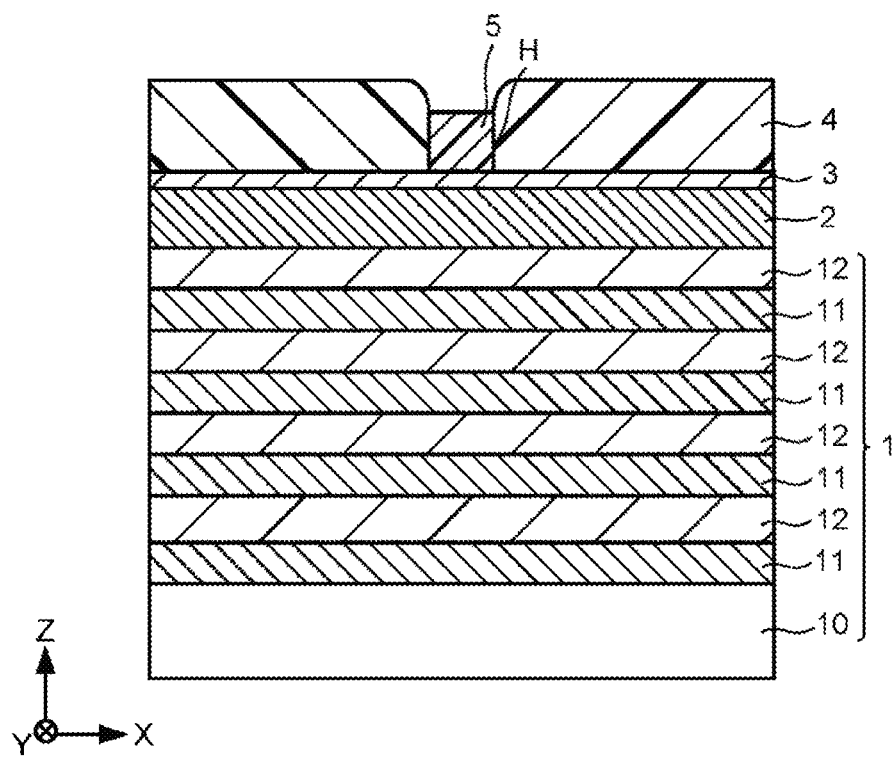
FIG. 15 illustrates a schematic cross-sectional view of a structure to illustrate an example of a metallization step according to the second embodiment.

FIG. 15 illustrates a schematic cross-sectional view of a structure to illustrate an example of the metallization step, and illustrates a part of the X-Z section of the workpiece 1. In the metallization step, the mask layer 4 is exposed to gas including a metal material to impregnate the mask layer 4 with the metal material. After the gas including the metal material is exhausted, the mask layer 4 is exposed to oxidizing gas including water, for example. The mask layer 4 is exposed to the oxidizing gas, so that the oxidizing gas can oxidize the metal material to form an oxide of the metal material. The oxidizing gas is exhausted after the exposure. The description of the metal material of the first embodiment may be used as appropriate for other descriptions of the metal material.

The mask layer 4 is impregnated with the metal material and is expanded as illustrated in FIG. 15, so that compressive stress is generated in the mask layer 4. On the other hand, since the filling layer 5 has fewer reaction sites or has no reaction sites, the gas including the metal material passes through the filling layer 5 without staying in the filling layer 5. Since the filling layer 5 is not expanded, the dimension of the opening H is maintained. In other words, the volume change amount of the filling layer 5 before and after the metallization step is smaller than that of the mask layer 4 before and after the metallization step. Furthermore, since the filling layer 5 adheres firmly to the mask layer 4, even though the mask layer 4 is expanded, the filling layer 5 is hardly peeled off from the mask layer 4. Consequently, it is possible to suppress deformation of the pattern due to the expansion of the mask layer 4.

Thermal Annealing Step

Figure 16:
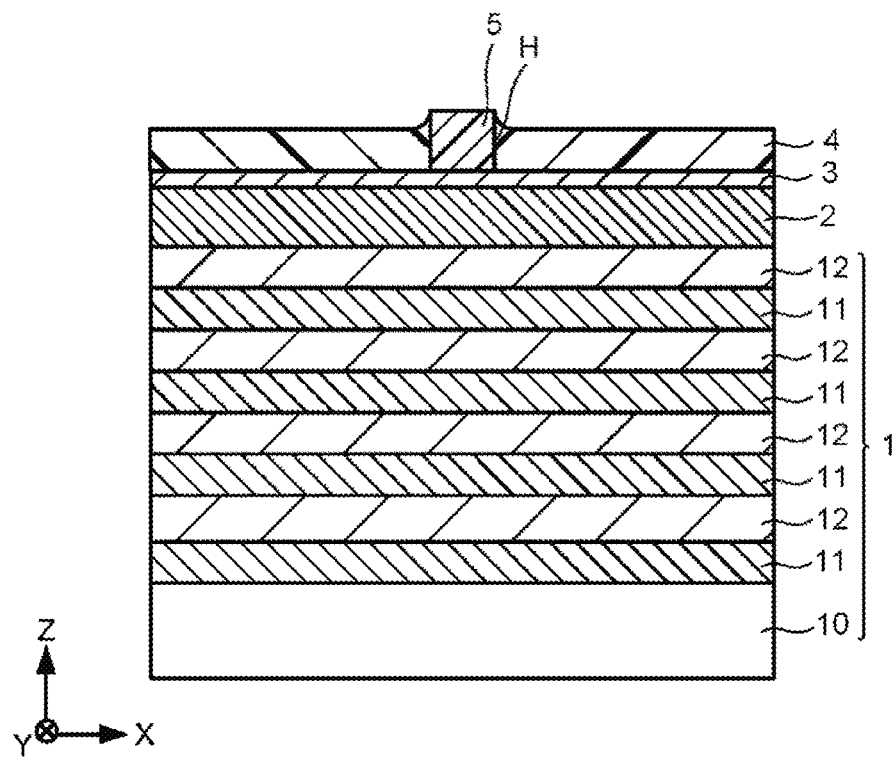
FIG. 16 illustrates a schematic cross-sectional view of a structure to illustrate an example of a thermal annealing step according to the second embodiment.

FIG. 16 illustrates a schematic cross-sectional view of a structure to illustrate an example of the thermal annealing step, and illustrates a part of the X-Z section of the workpiece 1. In the thermal annealing step, the mask layer 4 is annealed to promote crystallization of the oxide of the metal material in the mask layer 4. In this way, it is possible to enhance etching tolerance of the etching mask, particularly, high RIE tolerance. For example, when a pattern having a high aspect ratio is formed, since the etching mask is exposed to etching gas for a long time, high etching tolerance is required. Preferably, the annealing temperature is equal to or more than the crystallization temperature of the oxide of the metal material introduced into the mask layer 4, for example. For that reason, the annealing temperature is appropriately set depending on the type of a metal material to be used.

In the thermal annealing step, as illustrated in FIG. 16, the mask layer 4 is contracted and tensile stress is generated in the mask layer 4. However, since the filling layer 5 adheres firmly to the mask layer 4, even though the mask layer 4 is contracted, the filling layer 5 is hardly peeled off from the mask layer 4. The thermal annealing step may not be performed.

First Removal Step

Figure 17:
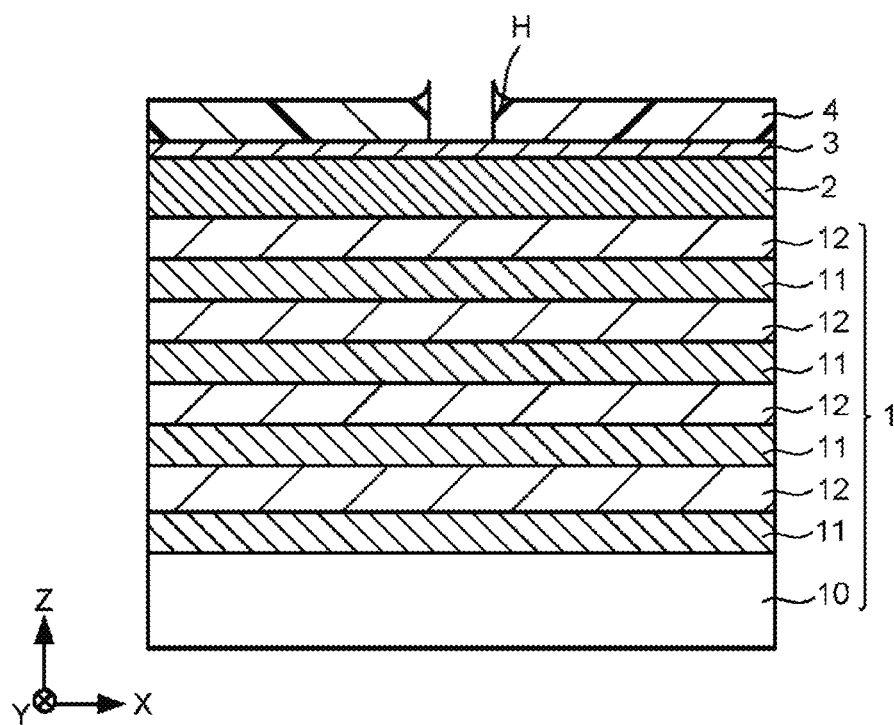
FIG. 17 illustrates a schematic cross-sectional view of a structure to illustrate an example of a first removal step according to the second embodiment.

FIG. 17 illustrates a schematic cross-sectional view of a structure to illustrate an example of the first removal step, and illustrates a part of the X-Z section of the workpiece 1. In the first removal step, as illustrated in FIG. 17, the filling layer 5 is removed from the opening H. The filling layer 5 is removed using dry etching or wet etching, for example. When the wet etching is used, an etching stop layer such as a silicon nitride film may be formed under the mask layer 4.

Etching Step

Figure 18:
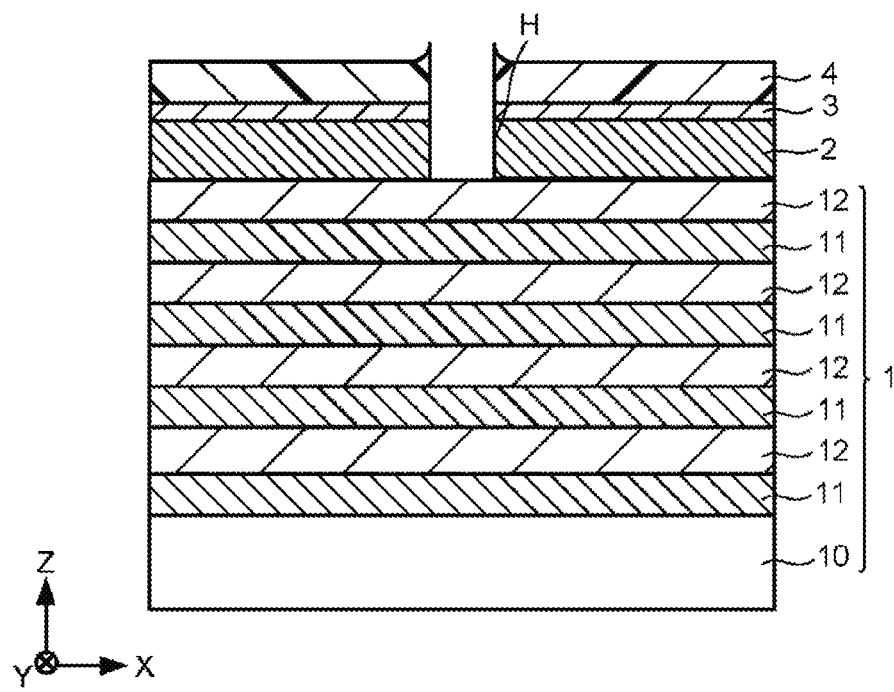
FIG. 18 illustrates a schematic cross-sectional view of a structure to illustrate an example of an etching step according to the second embodiment.

FIG. 18 illustrates a schematic cross-sectional view of a structure to illustrate an example of the etching step, and illustrates a part of the X-Z section of the workpiece 1. In the etching step, as illustrated in FIG. 18, the intermediate film 3 and the mask layer 2 are etched using the mask layer 4 to transfer the pattern of the mask layer 4 to the mask layer 2. The intermediate film 3 and the mask layer 2 are etched using dry etching or wet etching, for example.

Second Removal Step

Figure 19:
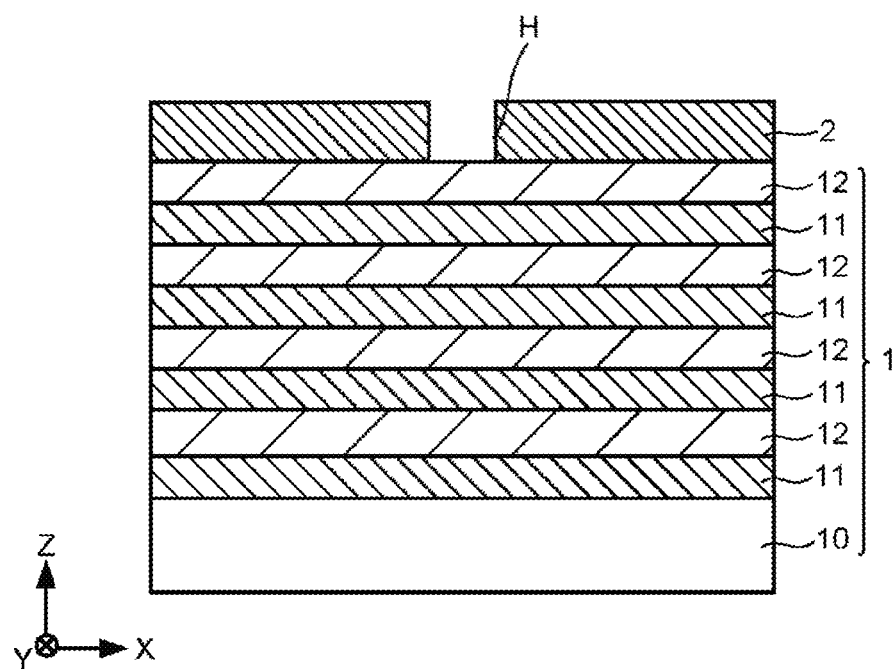
FIG. 19 illustrates a schematic cross-sectional view of a structure to illustrate an example of a second removal step according to the second embodiment.

FIG. 19 illustrates a schematic cross-sectional view of a structure to illustrate an example of the second removal step, and illustrates a part of the X-Z section of the workpiece 1. In the second removal step, as illustrated in FIG. 19, the intermediate film 3 and the mask layer 4 are removed. The intermediate film 3 and the mask layer 4 are removed by surface treatment such as etching and CMP, for example.

As described above, in the present embodiment, after forming the filling layer 5 having fewer reaction sites or no reaction sites, the mask layer 4 is metallized, so that it is possible to suppress deformation of the pattern due to the expansion of the mask layer 4. The mask layer 2 is etched using the mask layer 4, so that it is possible to enhance the dimensional accuracy of the hard mask. In the present embodiment, no metallization of the mask layer 2 is required.

Third Embodiment

In the present embodiment, a description will be given for another example of a method for forming an etching mask when a pattern is formed on the mask layer 4 using the DSA technology in the second embodiment. Similarly to the second embodiment, the other example of the method for forming the etching mask of the present embodiment includes the first mask layer forming step (S2-1), the intermediate film forming step (S2-2), the second mask layer forming step (S2-3), the pattern forming step (S2-4), the filling layer forming step (S2-5), the metallization step (S2-6), the thermal annealing step (S2-7), the first removal step (S2-8), the etching step (S2-9), and the second removal step (S2-10). Since the first mask layer forming step, the intermediate film forming step, the second mask layer forming step, the first removal step, the etching step, and the second removal step are the same as the first mask layer forming step, the intermediate film forming step, the second mask layer forming step, the first removal step, the etching step, and the second removal step in the second embodiment, except that a block copolymer is used for the mask layer 4, a description thereof will be omitted.

Pattern Forming Step

Figure 20:
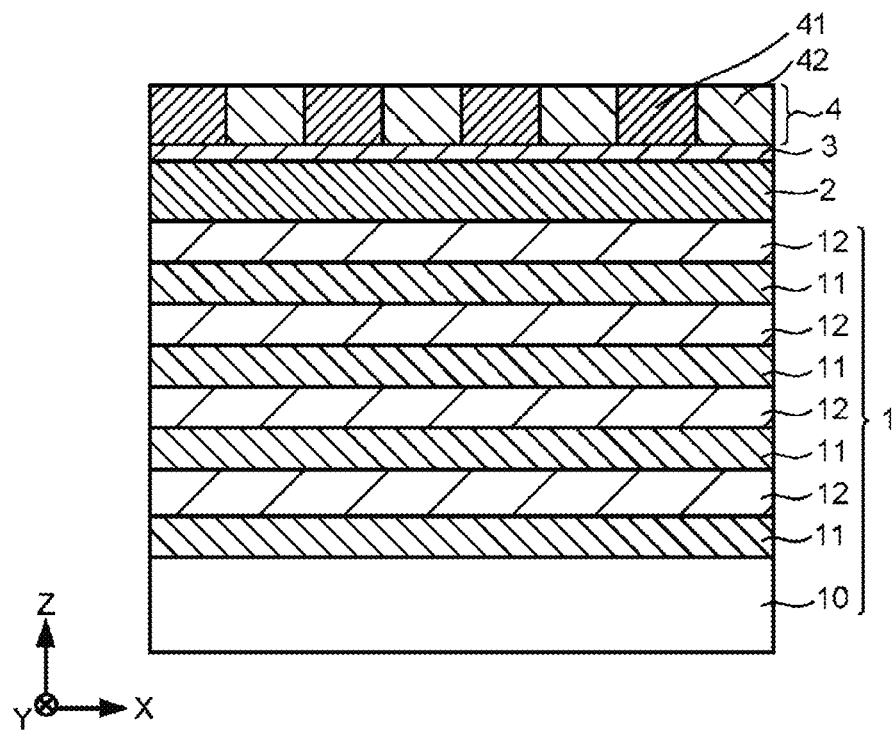
FIG. 20 illustrates a schematic cross-sectional view of a structure to illustrate an example of a pattern forming step according to a third embodiment.
Figure 21:
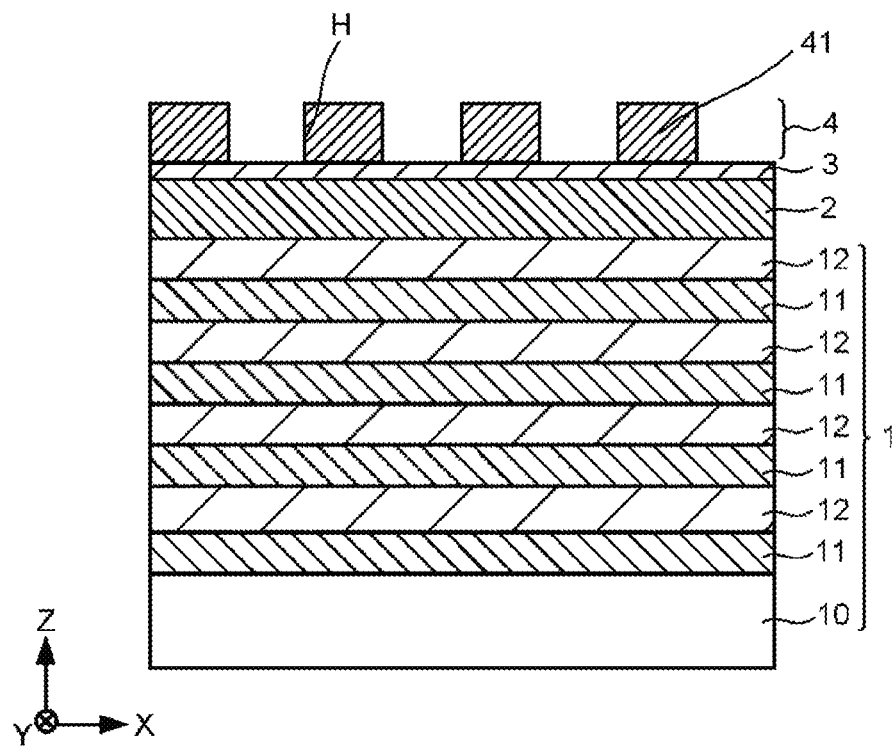
FIG. 21 illustrates a schematic cross-sectional view of a structure to illustrate an example of the pattern forming step according to the third embodiment.

FIG. 20 and FIG. 21 illustrate schematic cross-sectional views of a structure to illustrate an example of the pattern forming step, and illustrate a part of the X-Z section of the workpiece 1. In the pattern forming step, the mask layer 4 containing a polymer is heated and phase-separated. The polymer includes polystyrene-b-polymethyl methacrylate, for example. By the phase separation, a first polymer layer 41 and a second polymer layer 42 are formed as illustrated in FIG. 20. The first polymer layer 41 includes polymethyl methacrylate, for example. The second polymer layer 42 includes polystyrene, for example. Thereafter, as illustrated in FIG. 21, the second polymer layer 42 can be removed to form a pattern including openings H. The mask layer 4 is processed using the DSA technology, so that it is possible to more easily form a fine pattern.

Filling Layer Forming Step

Figure 22:
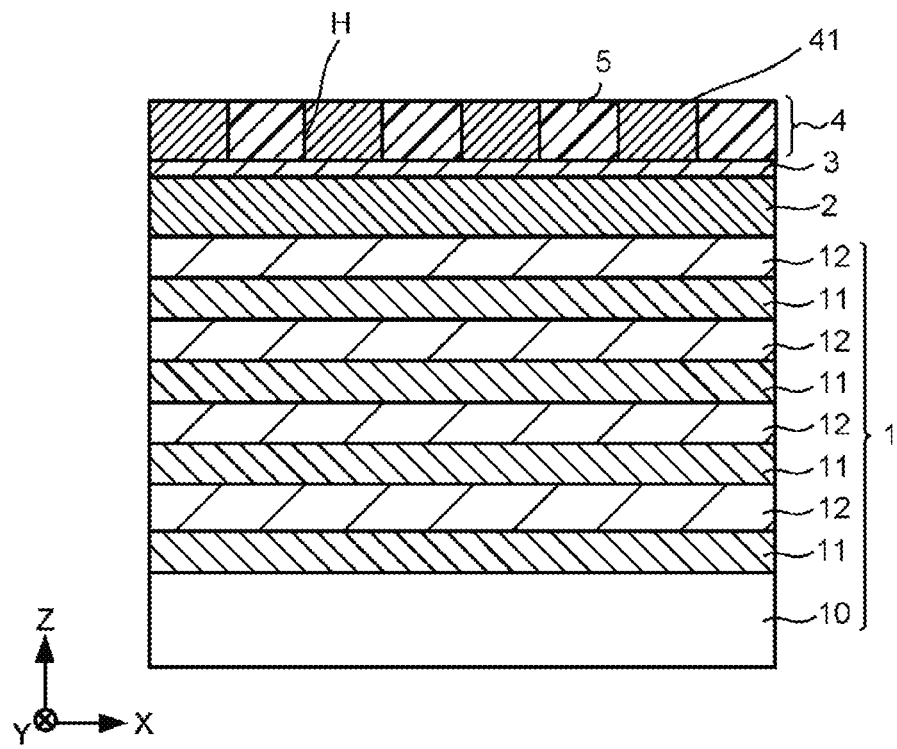
FIG. 22 illustrates a schematic cross-sectional view of a structure to illustrate an example of a filling layer forming step according to the third embodiment.

FIG. 22 illustrates a schematic cross-sectional view of a structure to illustrate an example of the filling layer forming step, and illustrate a part of the X-Z section of the workpiece 1. In the filling layer forming step, a filling layer 5 is formed on the mask layer 4 and in the openings H, and for example, the surface of the filling layer 5 is processed to be level with the surface of the mask layer 4 by surface treatment such as etching and CMP as illustrated in FIG. 22. The present disclosure is not limited thereto and the filling layer 5 may be formed using a spin coating method, for example. The description of the filling layer 5 of the first embodiment may be used as appropriate for other descriptions of the filling layer 5.

After the mask layer 4 is processed and before the filling layer 5 is formed, for example, a step of exposing the mask layer 4 to a plasma including oxygen may be performed. In this way, for example, impurities attached to the surface of the mask layer 4 during the pattern forming step can be removed, so that adhesion between the mask layer 4 and the filling layer 5 can be further enhanced.

Metallization Step

Figure 23:
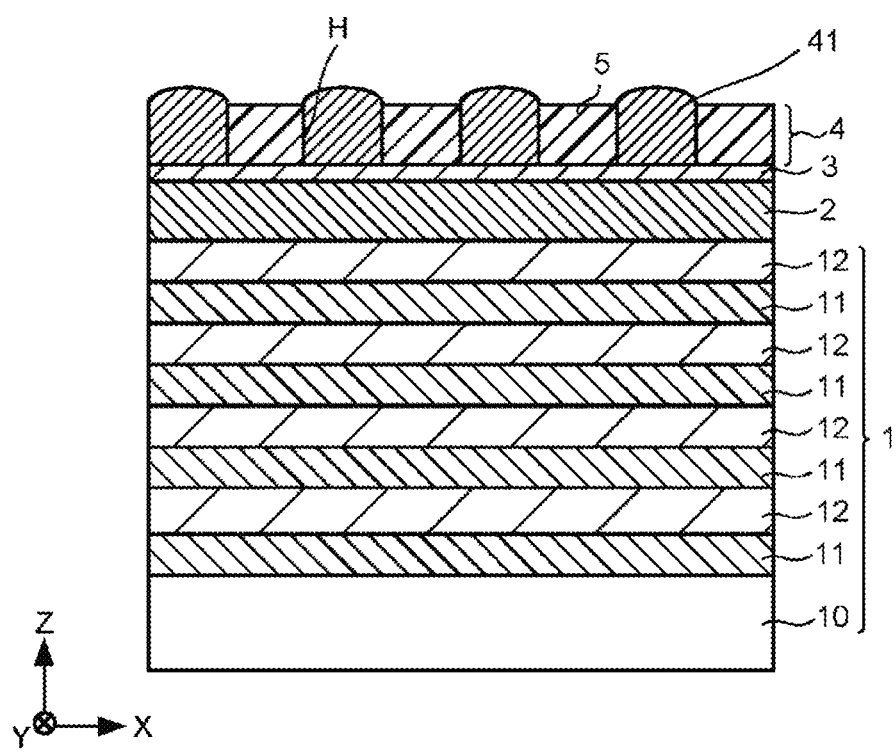
FIG. 23 illustrates a schematic cross-sectional view of a structure to illustrate an example of a metallization step according to the third embodiment.

FIG. 23 illustrates a schematic cross-sectional view of a structure to illustrate an example of the metallization step, and illustrates a part of the X-Z section of the workpiece 1. In the metallization step, the mask layer 4 is exposed to gas including a metal material to impregnate the mask layer 4 with the metal material. After the gas including the metal material is exhausted, the mask layer 4 is exposed to oxidizing gas including water, for example. The mask layer 4 is exposed to the oxidizing gas, so that the oxidizing gas can oxidize the metal material to form an oxide of the metal material. The oxidizing gas is exhausted after the exposure. The description of the metal material of the first embodiment may be used as appropriate for other descriptions of the metal material.

The mask layer 4 is impregnated with the metal material and is expanded as illustrated in FIG. 23, so that compressive stress is generated in the mask layer 4. On the other hand, since the filling layer 5 has fewer reaction sites or has no reaction sites, the gas including the metal material passes through the filling layer 5 without staying in the filling layer 5. Since the filling layer 5 is not expanded, the dimension of the opening H is maintained. In other words, the volume change amount of the filling layer 5 before and after the metallization step is smaller than that of the mask layer 4 before and after the metallization step. Furthermore, since the filling layer 5 adheres firmly to the mask layer 4, even though the mask layer 4 is expanded, the filling layer 5 is hardly peeled off from the mask layer 4. Consequently, it is possible to suppress deformation of the pattern due to the expansion of the mask layer 4.

Thermal Annealing Step

Figure 24:
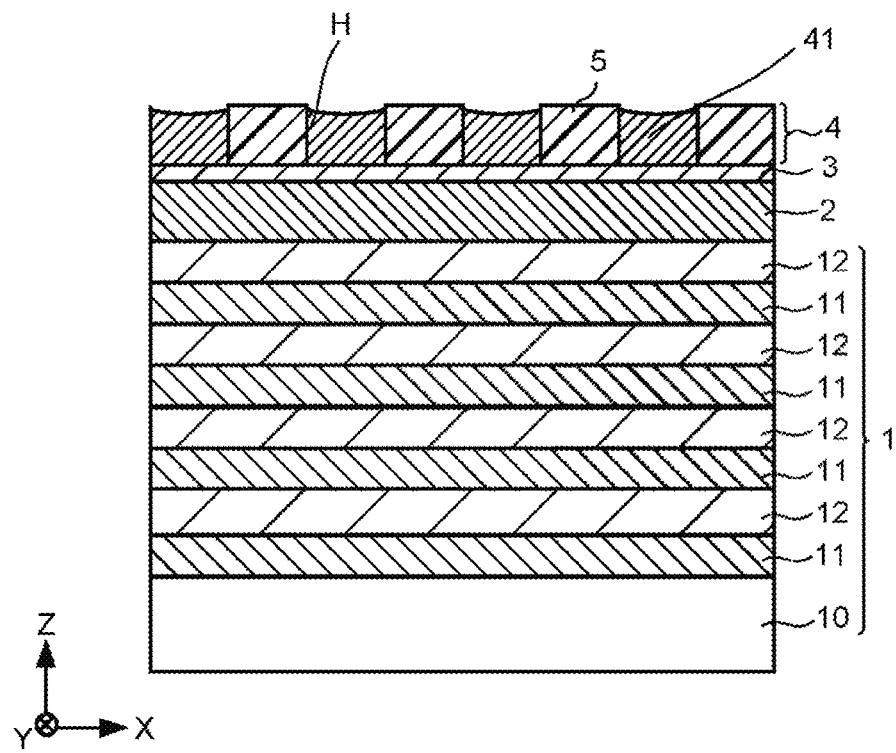
FIG. 24 illustrates a schematic cross-sectional view of a structure to illustrate an example of a thermal annealing step according to the third embodiment.

FIG. 24 illustrates a schematic cross-sectional view of a structure to illustrate an example of the thermal annealing step, and illustrates a part of the X-Z section of the workpiece 1. In the thermal annealing step, the mask layer 4 is annealed to promote crystallization of the oxide of the metal material in the mask layer 4. In this way, it is possible to enhance etching tolerance of the etching mask, particularly, high RIE tolerance. For example, when a pattern having a high aspect ratio is formed, since the etching mask is exposed to etching gas for a long time, high etching tolerance is required. Preferably, the annealing temperature is equal to or more than the crystallization temperature of the oxide of the metal material introduced into the mask layer 4, for example. For that reason, the annealing temperature is appropriately set depending on the type of a metal material to be used. The thermal annealing step may not be performed.

In the thermal annealing step, as illustrated in FIG. 24, the mask layer 4 is contracted and tensile stress is generated in the mask layer 4. However, since the filling layer 5 adheres firmly to the mask layer 4, even though the mask layer 4 is contracted, the filling layer 5 is hardly peeled off from the mask layer 4. The thermal annealing step may not be performed.

As described above, in the present embodiment, after forming the filling layer 5 having fewer reaction sites or no reaction sites, the mask layer 4 is metallized, so that it is possible to suppress deformation of the pattern due to the expansion of the mask layer 4. The mask layer 2 is etched using the mask layer 4, so that it is possible to enhance the dimensional accuracy of the hard mask. In the present embodiment, no metallization of the mask layer 2 is required.

Fourth Embodiment

In the present embodiment, a description will be given for another example of a method for forming an etching mask when the mask layer 2 is formed by alternately stacking at least two types of organic layers. Similarly to the first embodiment, the other example of the method for forming the etching mask of the present embodiment includes the first mask layer forming step (S1-1), the intermediate film forming step (S1-2), the second mask layer forming step (S1-3), the pattern forming step (S1-4), the etching step (S1-5), the first removal step (S1-6), the filling layer forming step (S1-7), the metallization step (S1-8), the thermal annealing step (S1-9), and the second removal step (S1-10). Since the intermediate film forming step, the second mask layer forming step, the pattern forming step, the etching step, the first removal step, and the second removal step are the same as the intermediate film forming step, the second mask layer forming step, the pattern forming step, the etching step, the first removal step, and the second removal step of the first embodiment, a description thereof will be omitted.

Mask Layer Forming Step

Figure 25:
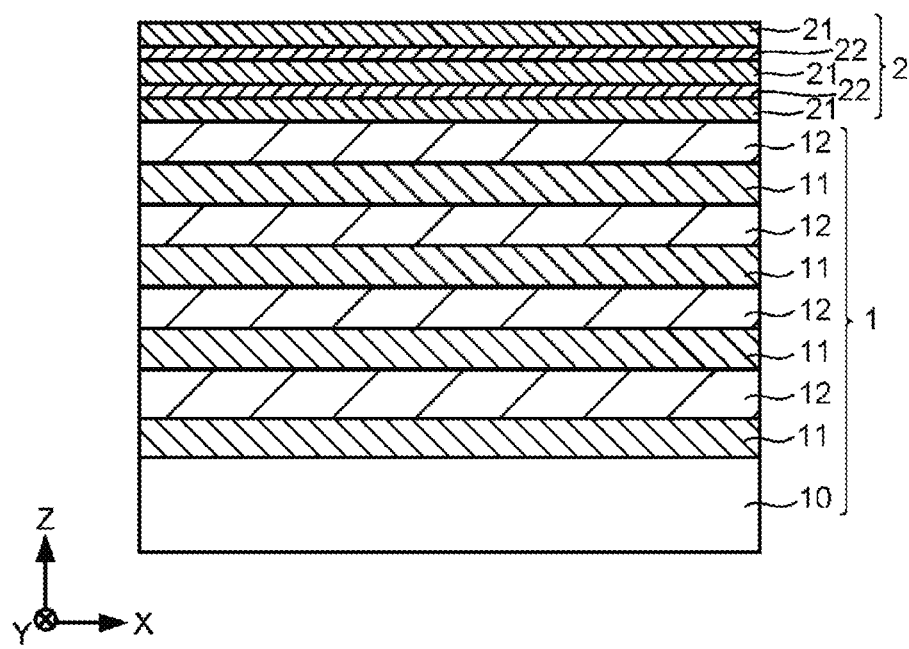
FIG. 25 illustrates a schematic cross-sectional view of a structure to illustrate an example of a mask layer forming step according to a fourth embodiment.

FIG. 25 illustrates a schematic cross-sectional view of a structure to illustrate an example of the mask layer forming step, and illustrate a part of the X-Z section of a workpiece 1. In the mask layer forming step, as illustrated in FIG. 25, a first organic layer 21 and a second organic layer 22 are alternately stacked on the workpiece 1 to form the mask layer 2. The number of stacked layers of the first organic layer 21 and the second organic layer 22 is not limited to the number of stacked layers illustrated in FIG. 25. Since the workpiece 1 is the same as the workpiece 1 of the first embodiment, a description thereof will be omitted.

The first organic layer 21 contains an organic material having reaction sites that react with a metal material introduced in the metallization step. The organic material includes an SOC film and a photoresist, for example.

The second organic layer 22 has a function as a stress relaxation layer. The second organic layer 22 contains an organic material in which the number of reaction sites is smaller than that in the first organic layer 21 or there are no reaction sites. The organic material includes an SOC film and a photoresist, for example.

Filling Layer Forming Step

Figure 26:
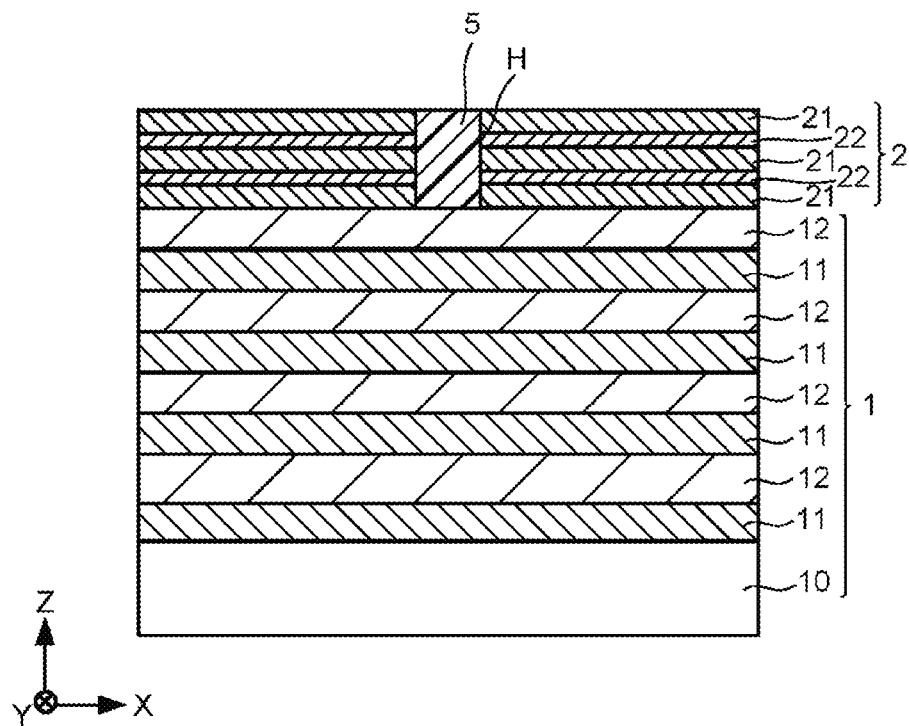
FIG. 26 illustrates a schematic cross-sectional view of a structure to illustrate an example of a filling layer forming step according to the fourth embodiment.

FIG. 26 illustrates a schematic cross-sectional view of a structure to illustrate an example of the filling layer forming step, and illustrate a part of the X-Z section of the workpiece 1. In the filling layer forming step, a filling layer 5 is formed on the mask layer 2 and in the opening H, and for example, the surface of the filling layer 5 is processed to be level with the surface of the mask layer 2 by surface treatment such as etching and CMP as illustrated in FIG. 26. The present disclosure is not limited thereto and the filling layer 5 may be formed using a spin coating method, for example. The filling layer 5 contains an organic material in which the number of reaction sites is smaller than that in the first organic layer 21 or there are no reaction sites. The organic material includes an SOC film, silicon oxide, or polysilazane, for example. The description of the filling layer 5 of the first embodiment may be used as appropriate for other descriptions of the filling layer 5.

After the mask layer 2 is processed and before the filling layer 5 is formed, for example, a step of exposing the mask layer 2 to a plasma including oxygen may be performed. In this way, for example, impurities attached to the surface of the mask layer 2 during the etching step can be removed, so that adhesion between the mask layer 2 and the filling layer 5 can be further enhanced.

Metallization Step

Figure 27:
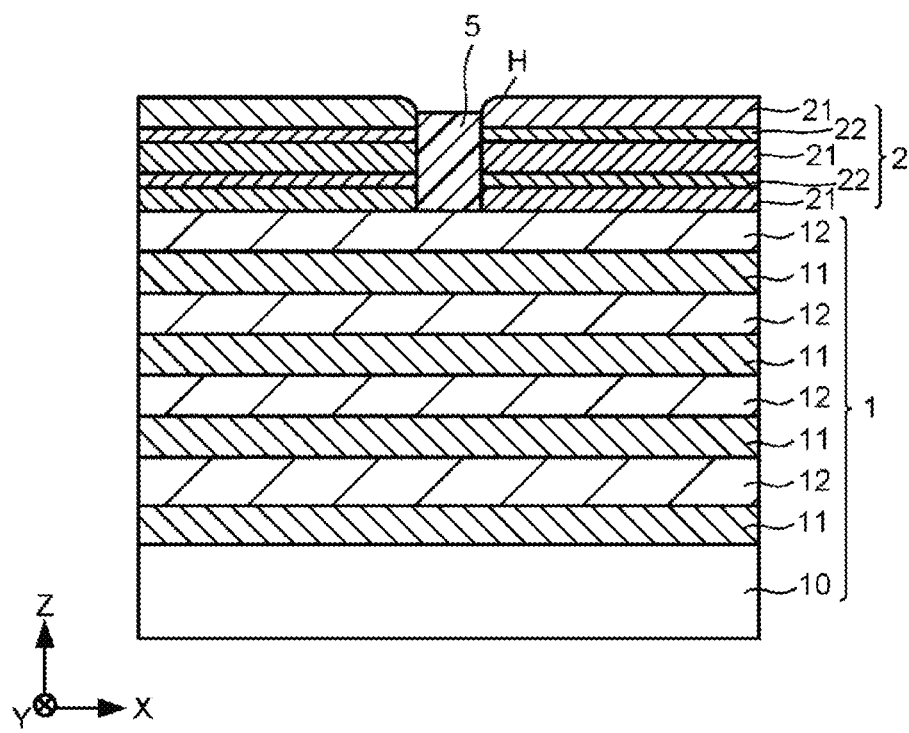
FIG. 27 illustrates a schematic cross-sectional view of a structure to illustrate an example of a metallization step according to the fourth embodiment.

FIG. 27 illustrates a schematic cross-sectional view of a structure to illustrate an example of the metallization step, and illustrates a part of the X-Z section of the workpiece 1. In the metallization step, the mask layer 2 is exposed to gas including a metal material to impregnate the mask layer 2 with the metal material. After the gas including the metal material is exhausted, the mask layer 2 is exposed to oxidizing gas including water, for example. The mask layer 2 is exposed to the oxidizing gas, so that the oxidizing gas can oxidize the metal material to form an oxide of the metal material. The oxidizing gas is exhausted after the exposure. The description of the metal material of the first embodiment may be used as appropriate for other descriptions of the metal material.

The first organic layer 21 is impregnated with the metal material and is expanded as illustrated in FIG. 27, so that stress is generated at an interface between the workpiece 1 and the mask layer 2. On the other hand, since the second organic layer 22 has fewer reaction sites or has no reaction sites, the second organic layer 22 has a small expansion due to the impregnation of the metal material as compared with the first organic layer 21. In other words, the volume change amount of the second organic layer 22 before and after the metallization step is smaller than that of the first organic layer 21 before and after the metallization step. Furthermore, since the second organic layer 22 is an elastic body, stress is relieved at an interface between the first organic layer 21 and the second organic layer 22 to suppress stress concentration at the interface between the workpiece 1 and the mask layer 2, so that it is possible to suppress the peeling of the mask layer 2.

Moreover, since the filling layer 5 has fewer reaction sites than in the first organic layer 21 or has no reaction sites, the gas including the metal material passes through the filling layer 5 without staying in the filling layer 5. Since the filling layer 5 is not expanded, the dimension of the opening H is maintained. In other words, the volume change amount of the filling layer 5 before and after the metallization step is smaller than that of the mask layer 2 including the first organic layer 21 and the second organic layer 22 before and after the metallization step. Furthermore, since the filling layer 5 adheres firmly to the mask layer 2, even though the mask layer 2 is expanded, the filling layer 5 is hardly peeled off from the mask layer 2. Consequently, it is possible to suppress deformation of the pattern due to the expansion of the mask layer 2 including the first organic layer 21 and the second organic layer 22.

Thermal Annealing Step

Figure 28:
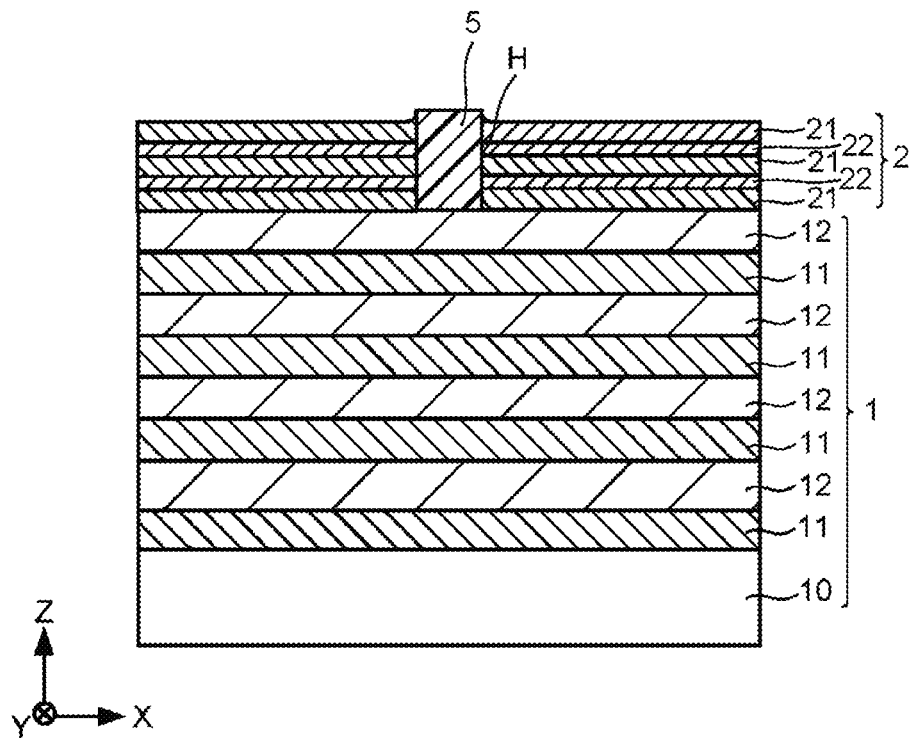
FIG. 28 illustrates a schematic cross-sectional view of a structure to illustrate an example of a thermal annealing step according to the fourth embodiment.

FIG. 28 illustrates a schematic cross-sectional view of a structure to illustrate an example of the thermal annealing step, and illustrates a part of the X-Z section of the workpiece 1. In the thermal annealing step, the mask layer 2 is annealed to promote crystallization of the oxide of the metal material in the mask layer 2. In this way, it is possible to enhance etching tolerance of the etching mask, particularly, high reactive ion etching (RIE) tolerance. For example, when a pattern having a high aspect ratio is formed, since the etching mask is exposed to etching gas for a long time, high etching tolerance is required. Preferably, the annealing temperature is equal to or more than the crystallization temperature of the oxide of the metal material introduced into the mask layer 2, for example. For that reason, the annealing temperature is appropriately set depending on the type of a metal material to be used.

In the thermal annealing step, as illustrated in FIG. 28, the mask layer 2 including the first organic layer 21 and the second organic layer 22 is contracted and tensile stress is generated in the mask layer 2. However, since the filling layer 5 adheres firmly to the mask layer 2, even though the mask layer 2 is contracted, the filling layer 5 is hardly peeled off from the mask layer 2. The thermal annealing step may not be performed.

As described above, in the present embodiment, after forming the filling layer 5 having fewer reaction sites or no reaction sites, the mask stack is metallized, so that it is possible to suppress deformation of the pattern due to the expansion of the mask layer 2. As a result, it is possible to enhance the dimensional accuracy of the hard mask.

In the present embodiment, the filling layer 5 may not be formed. That is, in the present embodiment, the filling layer forming step and the second removal step may not be performed.

The present embodiment may be appropriately combined with the other embodiments. For example, instead of metallizing the mask layer 2, the mask layer 4 may be metallized similarly to the second embodiment or the third embodiment.

Fifth Embodiment

Figure 29:
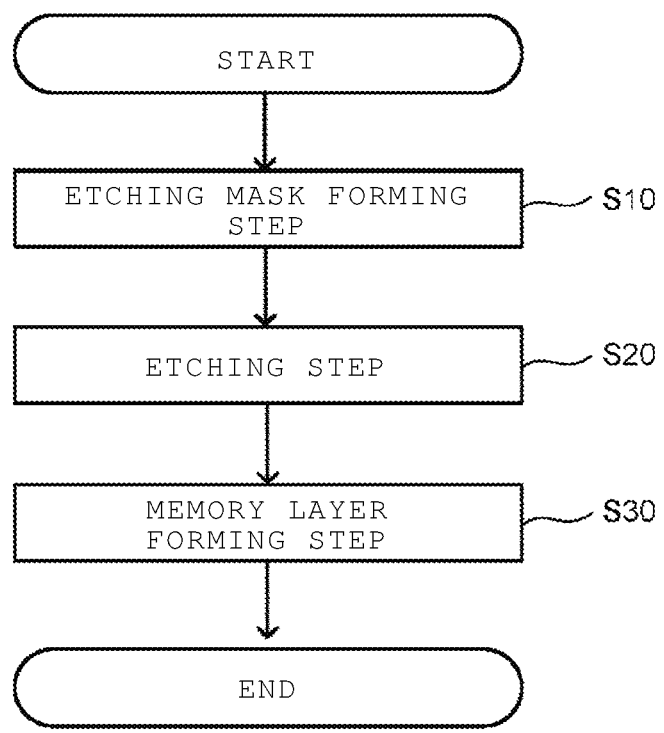
FIG. 29 is a flowchart illustrating an example of a method for manufacturing a semiconductor device according to a fifth embodiment.

FIG. 29 is a flowchart illustrating an example of a method for manufacturing a semiconductor device according to a fifth embodiment. As illustrated in FIG. 29, the method for manufacturing the semiconductor device includes an etching mask forming step (S10), an etching step (S20), and a memory layer forming step (S30).

Etching Mask Forming Step

Figure 30:
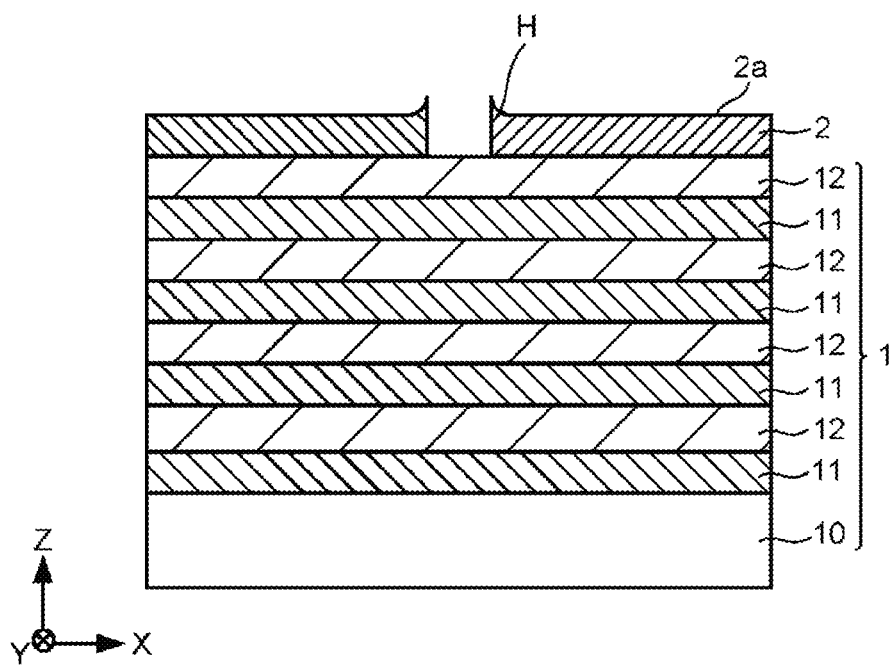
FIG. 30 illustrates a schematic cross-sectional view of a structure to illustrate an example of an etching mask forming step according to the fifth embodiment.

FIG. 30 illustrates a schematic cross-sectional view of a structure to illustrate an example of the etching mask forming step, and illustrates a part of the X-Z section of the workpiece 1. In the etching mask forming step, an etching mask 2a including the metallized mask layer 2 is formed on the workpiece 1. The etching mask 2a is a hard mask and has a pattern including the opening H. Although FIG. 30 illustrates the etching mask 2a formed by the method of the first embodiment, the present disclosure is not limited thereto and the etching mask 2a may be formed using any one of the examples of the etching mask forming methods according to the first to fourth embodiments.

Etching Step

Figure 31:
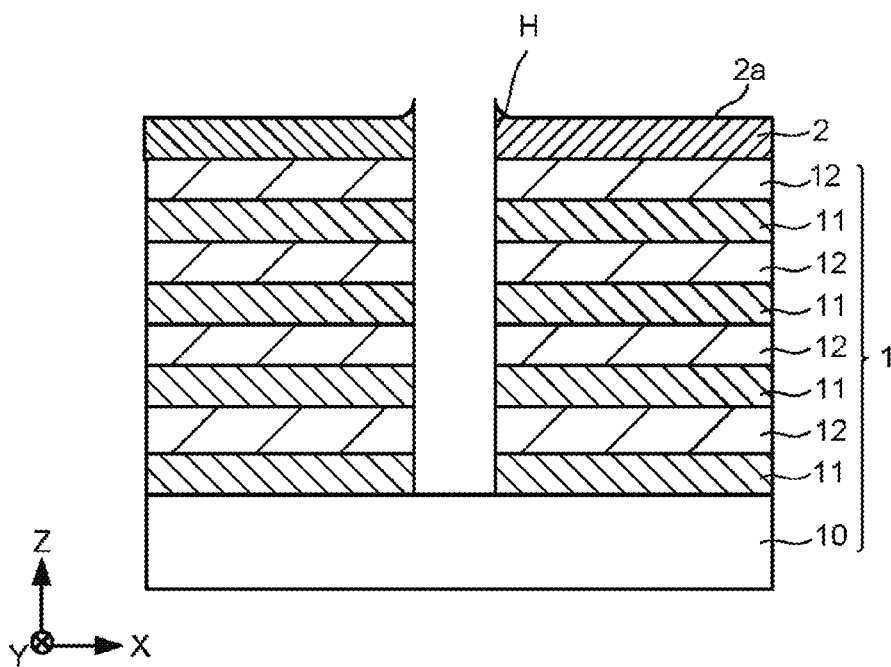
FIG. 31 illustrates a schematic cross-sectional view of a structure to illustrate an example of an etching step according to the fifth embodiment.

FIG. 31 illustrates a schematic cross-sectional view of a structure to illustrate an example of the etching step, and illustrates a part of the X-Z section of the workpiece 1. In the etching step, as illustrated in FIG. 31, the workpiece 1 is etched using the etching mask 2a. The workpiece 1 may be etched by RIE, for example. The etching mask 2a is removed after the etching. When the workpiece 1 is etched by the etching mask 2a using the mask layer 2 in the fourth embodiment, since chamber atmosphere changes according to the first organic layer 21 and the second organic layer 22 as the etching progresses, there may be irregularities along the inner wall surface of the opening H.

Memory Layer Forming Step

Figure 32:
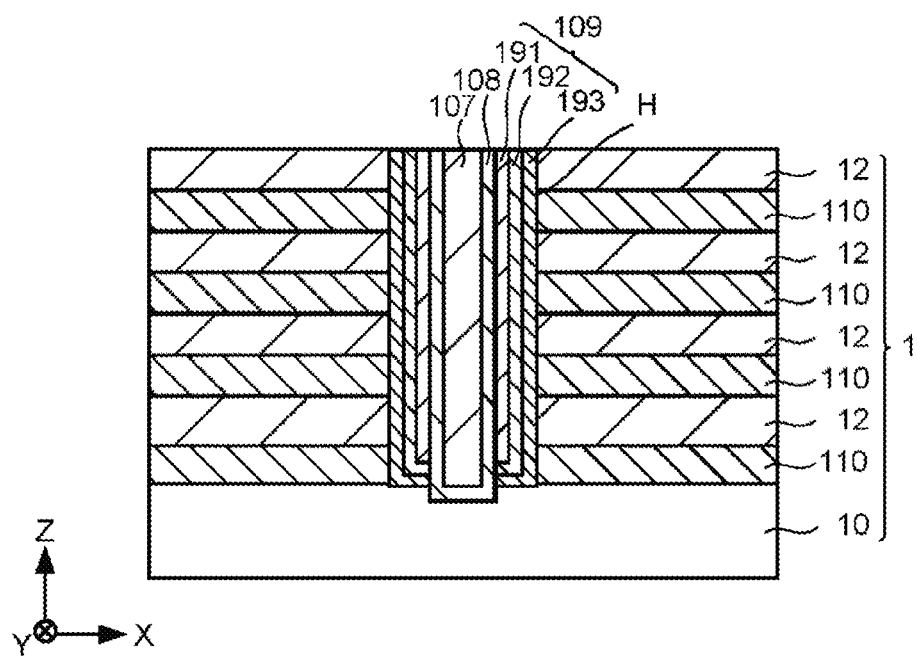
FIG. 32 illustrates a schematic cross-sectional view of a structure to illustrate an example of a memory layer forming step according to the fifth embodiment.

FIG. 32 illustrates a schematic cross-sectional view of a structure to illustrate an example of the memory layer forming step, and illustrates a part of the X-Z section of the workpiece 1. In the memory layer forming step, a memory film 109 including a block insulating film 193, a charge storage layer 192, and a tunnel insulating film 191, a semiconductor channel layer 108, and a core insulating film 107 are formed in this order in the opening H. The core insulating film 107, the semiconductor channel layer 108, and the memory film 109 serve as a memory layer constituting a memory cell.

As the core insulating film 107, it is possible to use a silicon oxide film, for example. As the semiconductor channel layer 108, it is possible to use a polysilicon layer, for example. As the tunnel insulating film 191, it is possible to use a stacked film having a silicon oxide film and a silicon oxynitride film, for example. As the charge storage layer 192, it is possible to use a silicon nitride film, for example. As the block insulating film 193, it is possible to use a silicon oxide film, for example.

After the memory film 109 is formed, the first layer 11 is removed, a cavity is formed between the second layers 12, and a plurality of conductive films are stacked in the cavity to form conductive layers 110. The conductive layer 110 has a function as a gate electrode (word line), for example. Moreover, contact plugs, wirings, interlayer insulating films, and the like are formed on the substrate 10. In this way, it is possible to manufacture the semiconductor device.

As described above, in the present embodiment, a hard mask having a pattern with high dimensional accuracy is formed and a workpiece can be etched using the hard mask, so that it is possible to more easily etch the workpiece even in the case of a pattern having a high aspect ratio.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for forming an etching mask, the method comprising:
   forming a mask layer containing an organic material on a layer to be patterned by a subsequent etching;
   processing the mask layer to form a pattern including an opening;
   forming a filling layer in the opening;
   impregnating the mask layer with a metal material in a state in which the filling layer is in the opening; and
   removing the filling layer, wherein
   the organic material includes reaction sites that react with the metal material, and the filling layer has fewer reaction sites per unit volume than the mask layer.

2. The method according to claim 1, wherein the organic material comprises a polymer with a carbonyl group.

3. The method according to claim 1, wherein the filling layer comprises at least one of silicon oxide and polysilazane.

4. The method according to claim 1, further comprising:
exposing the mask layer to a plasma including oxygen before forming the filling layer.

5. The method according to claim 1, further comprising:
annealing the mask layer after impregnating the mask layer with the metal material.

6. A method for manufacturing a semiconductor device comprising:
forming an etching mask on a substrate, the etching mask being formed according to the method of claim 1; and
etching the substrate using the etching mask.

7. A method for forming an etching mask, the method comprising:
forming a first mask layer containing a first organic material on a layer to be patterned by a subsequent etching;
forming an intermediate film on the first mask layer;
forming a second mask layer containing a second organic material on the intermediate film;
processing the second mask layer to form a pattern including an opening;
forming a filling layer in the opening;
impregnating the second mask layer with a metal material in a state in which the filling layer is in the opening;
removing the filling layer;
etching the intermediate film and the first mask layer by using the second mask layer; and
removing the intermediate film and the second mask layer, wherein
the second organic material in the second mask layer includes reaction sites that react with the metal material, and the reaction sites per unit volume of the filling layer is less the reaction sites per the unit volume of the second mask layer.

8. The method according to claim 7, wherein the second organic material comprises a polymer with a carbonyl group.

9. The method according to claim 7, wherein the second organic material is a photoresist.

10. The method according to claim 7, wherein the filling layer comprises at least one of silicon oxide and polysilazane.

11. The method according to claim 7, further comprising:
exposing the second mask layer to a plasma including oxygen before forming the filling layer.

12. The method according to claim 7, further comprising:
annealing the second mask layer after impregnating the second mask layer with the metal material.

13. A method for manufacturing a semiconductor device comprising:
forming an etching mask on a substrate, the etching mask being formed according to the method of claim 7; and
etching the substrate using the etching mask.

14. A method for forming an etching mask, the method comprising:
forming a mask layer by alternately stacking one or more first organic layers and one or more second organic layers on a layer to be patterned in a subsequent etching;
processing the mask layer to form a pattern including an opening penetrating the one or more first organic layers and the one or more second organic layers of the mask layer; and
impregnating the mask layer with a metal material, wherein
the second organic layer includes reaction sites that react with the metal material, and a number of the reaction sites per unit volume in the first organic layer is less than a number of the reaction sites per the unit volume in the second organic layer.

15. The method according to claim 14, further comprising:
forming a filling layer in the opening before impregnating the mask layer with the metal material; and
removing the filling layer after impregnating the mask layer with the metal material, wherein
a number of the reaction sites per unit volume in the filling layer is less than the number of the reaction sites per the unit volume in the first organic layer.

16. The method according to claim 15, further comprising:
exposing the mask layer to a plasma including oxygen before forming the filling layer.

17. The method according to claim 15, wherein the filling layer contains at least one of silicon oxide and polysilazane.

18. The method according to claim 14, further comprising:
annealing the mask layer after impregnating the mask layer with the metal material.

19. The method according to claim 14, wherein each of the first organic layer and the second organic layer is a thin film.

20. A method for manufacturing a semiconductor device comprising:
forming an etching mask on a substrate, the etching mask being formed according to the method of claim 14; and
etching the substrate using the etching mask.

* * * * *